United States Patent
Shimomura et al.

(10) Patent No.: US 6,674,153 B2
(45) Date of Patent: Jan. 6, 2004

(54) SEMICONDUCTOR DEVICE UTILIZING PAD TO PAD WIRE INTERCONNECTION FOR IMPROVING DETECTION OF FAILED REGION ON THE DEVICE

(75) Inventors: Takehiko Shimomura, Tokyo (JP); Katsuyoshi Watanabe, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/163,508

(22) Filed: Jun. 7, 2002

(65) Prior Publication Data

US 2003/0111741 A1 Jun. 19, 2003

(30) Foreign Application Priority Data

Dec. 14, 2001 (JP) .......................................... 2001-381993

(51) Int. Cl.[7] .......................... H01L 23/552; H01R 9/00
(52) U.S. Cl. ....................... 257/659; 257/692; 257/724; 257/725; 257/786; 361/772; 361/777
(58) Field of Search ................................. 257/678, 685, 257/700, 725, 734; 361/600, 659, 679, 728, 729, 748, 760, 772–777; 438/26, 51, 55, 64, 106; 174/32, 52.1–52.4, 250, 261

(56) References Cited

U.S. PATENT DOCUMENTS

| | | | | |
|---|---|---|---|---|
| 4,903,114 A | * | 2/1990 | Aoki et al. | 257/666 |
| 5,110,761 A | * | 5/1992 | Kalfus et al. | 228/123.1 |
| 5,233,503 A | * | 8/1993 | Furuhata | 361/783 |
| 5,325,268 A | * | 6/1994 | Nachnani et al. | 361/767 |
| 5,513,076 A | * | 4/1996 | Werther | 361/784 |
| 5,625,944 A | * | 5/1997 | Werther | 29/843 |
| 5,712,768 A | * | 1/1998 | Werther | 361/767 |
| 6,064,116 A | * | 5/2000 | Akram | 257/723 |
| 6,299,463 B1 | * | 10/2001 | Akram | 439/107 |
| 6,339,256 B2 | * | 1/2002 | Akram | 257/691 |
| 2001/0011766 A1 | * | 8/2001 | Nishizawa et al. | 257/685 |

FOREIGN PATENT DOCUMENTS

| | | | | |
|---|---|---|---|---|
| JP | 04087358 A | * | 3/1992 | ......... H01L/25/04 |
| JP | 04087361 A | * | 3/1992 | ......... H01L/25/04 |
| JP | 04133347 A | * | 5/1992 | ......... H01L/27/04 |
| JP | 04133464 A | * | 5/1992 | ......... H01L/27/04 |
| JP | 04152543 | | 5/1992 | |
| JP | 0590499 | | 4/1993 | |
| JP | 0683990 | | 3/1994 | |

* cited by examiner

Primary Examiner—Alonzo Chambliss
(74) Attorney, Agent, or Firm—Burns, Doane, Swecker & Mathis, LLP

(57) ABSTRACT

A semiconductor device has: an inner active region 3 including a first electronic circuit formed on a semiconductor substrate; an outer active region 4 positioned between the edges 2a, 2b of the semiconductor substrate 2 and the inner active region 3 and including a second electronic circuit formed on the semiconductor substrate 2; a main bonding pad 6a for assembly formed inside a region where the inner active region 3 is opposed to the outer active region 4 and formed along the outer periphery of the inner active region 3; a sub-bonding pad 7 for analysis formed outside the opposing region 5 where the inner active region 3 is opposed to the outer active region 4; and a pad-to-pad interconnection wiring 8 for connecting the main bonding pad 6a to the sub-bonding pad 7.

7 Claims, 3 Drawing Sheets

SEMICONDUCTOR DEVICE UTILIZING PAD TO PAD WIRE INTERCONNECTION FOR IMPROVING DETECTION OF FAILED REGION ON THE DEVICE

BACKGROUND OF THE INVENTION

1. Field of the Invention

The present invention relates to a semiconductor device having an inner active region which includes a first electronic circuit formed inside a bonding pad for assembly and an outer active region which includes a second electronic circuit formed outside the boding pad for assembly.

2. Description of the Related Art

FIG. 6 is a plan view to show a configuration of a semiconductor device in the prior art. In FIG. 6 is shown a state where the semiconductor device is mounted on the die pad (not shown) of a lead frame and where bonding pads for assembly are connected to the leads of a lead frame by bonding wires. In FIG. 6, a reference numeral 101 denotes a semiconductor device; a reference numeral 102 denotes a rectangular semiconductor substrate; a reference numeral 103 denotes an inner active region including a first electronic circuit (not shown), which is formed in the central region of the semiconductor substrate 102 and has a predetermined function; a reference numeral 104 denotes an outer active region including the second electronic circuit (not shown), which is formed outside the semiconductor substrate 102 and has a predetermined function; a reference numeral 105 denotes an opposing region where the inner active region 103 is opposed to the outer active region 104; a reference numeral 106 denotes a bonding pad for assembly formed along the outer periphery of the inner active region 103; a reference numeral 106a denotes the bonding pad for assembly formed inside the opposing region 105; a reference numeral 106b denotes the bonding pad for assembly formed outside the opposing region 105.

A reference numeral 111 denotes a lead of a lead frame; and a reference numeral 112 denotes a bonding wire for connecting the bonding pad 106 for assembly to the lead 111.

In this manner, the semiconductor device 101 which is mounted on the die pad (not shown) of the lead frame and in which the bonding pads 106 for assembly are connected to the leads 111 of the lead frame by the bonding wires 112 is usually sealed with resin in this state and is set in a package.

Next, a conventional failure analysis method of a semiconductor device will be described. In the first place, in the state where the semiconductor is set in a package, the semiconductor device is inspected for electric characteristics to make sure a failed region.

Then, the package is opened to expose the surface of the semiconductor device. Then, in the same electric state as in the above mentioned inspection of electric characteristics, a failed point is narrowed down in a failed region by the use of an analyzing unit such as an optical microscope, an emission microscope, and an electron beam tester. The semiconductor device is visually checked for an abnormality from appearance by the optical microscope and then is inspected for an abnormal light emitting point by the emission microscope. If any abnormal point is not found even by these inspection, a wiring is inspected for an abnormal potential by the electron beam tester. In this manner, the failed point is narrowed down.

Thereafter, the minute failed point narrowed down in this manner is examined in detail by a physical analysis method to diagnose the cause of the failure.

Since the semiconductor device 101 in the prior art is constituted in the above manner, and the bonding wires 112 connected to the bonding pads 106a for assembly formed in the opposing region 105 where the inner active region 103 is opposed to the outer active region 104 pass over the outer active region 104. Therefore, according to the failure analysis method in the prior art, it is difficult to diagnose the cause of the failure by the use of the optical microscope, the emission microscope, and the electron beam tester and thus is impossible to narrow down the failed point.

SUMMARY OF THE INVENTION

The present invention has been made to solve the above mentioned problem. It is the object of the present invention to provide a semiconductor device in which a failed point can be easily narrowed down and which has an inner active region including the first electronic circuit formed inside assembly bonding pads and an outer active region including the second electronic circuit formed outside the assembly bonding pads.

A semiconductor device in accordance with the present invention includes: an inner active region including a first electronic circuit formed on the semiconductor substrate; an outer active region positioned between the edge of the semiconductor substrate and the inner active region and including a second electronic circuit formed on the semiconductor substrate; a main bonding pad formed inside an opposing region where the inner active region is opposed to the outer active region and along the outer periphery of the inner active region; a sub-bonding pad formed outside the region where the inner active region is opposed to the outer active region; and a pad-to-pad interconnection wiring for connecting the main bonding pad to the sub-bonding pad. By this arrangement it is possible to produce an effect that before the narrowing down of the failed point in the failed region in the outer active region, by removing the bonding wire passing over the failed region from the main bonding pad for assembly and by bonding the bonding wire removed from the main bonding pad for assembly to the sub-bonding pad for analysis connected to the main bonding pad for assembly to which the bonding wire has been bonded via the pad-to-pad interconnection wiring, the failed point can be narrowed down by the use of the analyzing unit such as the optical microscope, the emission microscope and the electron beam tester.

A semiconductor device in accordance with the present invention includes: an inner active region including a first electronic circuit formed on the semiconductor substrate; an outer active region positioned between the edge of the semiconductor substrate and the inner active region and including a second electronic circuit formed on the semiconductor substrate; a plurality of main bonding pad formed inside an opposing region where the inner active region is opposed to the outer active region and along the outer periphery of the inner active region; a sub-bonding pad formed outside the region where the inner active region is opposed to the outer active region; and a pad-to-pad interconnection wiring for electrically connecting any one of the main bonding pad to the sub-bonding pad. By this arrangement it is possible to produce an effect that before the narrowing down of the failed point in the failed region in the outer active region, by removing the bonding wire passing over the failed region from the main bonding pad for assembly and by bonding the bonding wire removed from the main bonding pad for assembly to the sub-bonding pad for analysis and by electrically connecting the main bonding pad for assembly from which the bonding wire is removed to the sub-bonding pad for analysis, the failed point can be narrowed down by the use of the analyzing unit such as the optical microscope, the emission microscope and the electron beam tester.

A semiconductor device in accordance with the present invention includes: an inner active region including a first electronic circuit formed on the semiconductor substrate; an outer active region positioned between the edge of the semiconductor substrate and the inner active region and including a second electronic circuit formed on the semiconductor substrate; a main bonding pad formed inside an opposing region where the inner active region is opposed to the outer active region and along the outer periphery of the inner active region; a circuit-to-circuit interconnection wiring for connecting the first electronic circuit to the second electronic circuit; and a scan register provided in the circuit-to-circuit interconnection wiring. By this arrangement it is possible to produce an effect that before the narrowing down of the failed point in the failed region in the active region, by removing the bonding wire passing over the failed region from the main bonding pad for assembly and by setting the respective scan registers at the state of "0" (GND level) or the state of "1" (power source level) such that the signal applied to the outer active region via the circuit-to-circuit interconnection wiring is made equal to the signal applied to the outer active region from the inner active region via the circuit-to-circuit interconnection wiring when the semiconductor device is inspected for the electric characteristics in the state where the semiconductor device is set in a package, the failed point can be narrowed down by the use of the analyzing unit such as the optical microscope, the emission microscope and the electron beam tester.

DESCRIPTION OF THE PREFERRED EMBODIMENTS

The preferred embodiments in accordance with the present invention will hereinafter be described.

Embodiment 1

Figure 1:
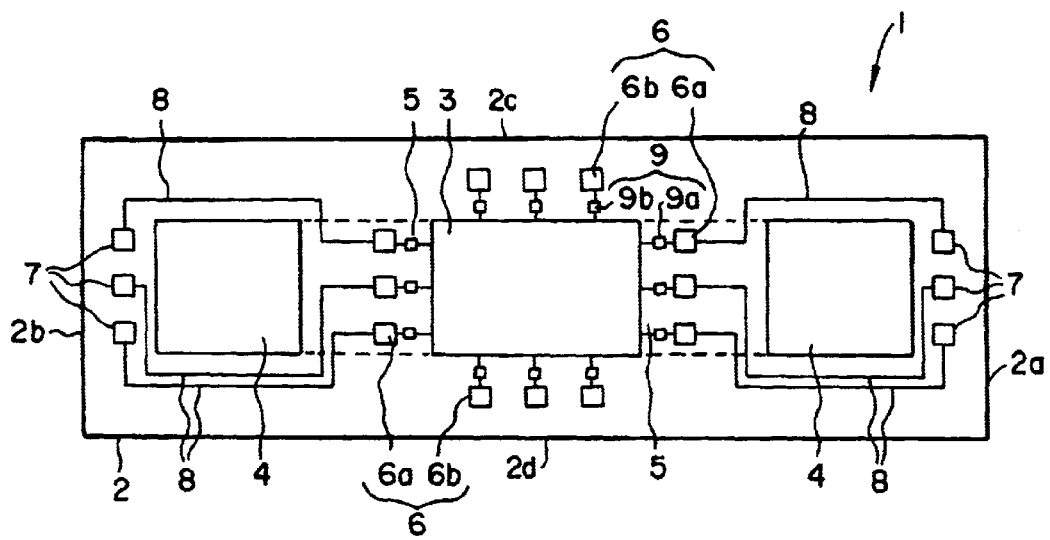
FIG. 1 is a plan view to show the configuration of a semiconductor device in accordance with an embodiment 1 of the present invention.

FIG. 1 is a plan view to show the configuration of a semiconductor device in accordance with an embodiment 1 of the present invention. In FIG. 1, a reference numeral 1 denotes a semiconductor device; a reference numeral 2 denotes a rectangular semiconductor substrate; reference numerals 2a to 2d denote the edges of the semiconductor substrate 2; a reference numeral 3 denotes an inner active region including a first electronic circuit (not shown), which is formed in the central region of the semiconductor substrate 2 and has a predetermined function; a reference numeral 4 denotes an outer active region including a second electronic circuit (not shown), which is formed between the edges 2a, 2b of the semiconductor substrate 2 and the inner active region 3 and has a predetermined function; a reference numeral 5 denotes an opposing region where the inner active region 3 is opposed to the outer active region 4; a reference numeral 6 denotes a main bonding pad for assembly formed along the outer periphery of the inner active region 3; a reference numeral 6a denotes a main bonding pad for assembly formed inside the opposing region 5; a reference numeral 6b denotes a main bonding pad for assembly formed outside the opposing region 5; a reference numeral 7 denotes a sub-bonding pad for analysis formed outside the opposing region 5; and a reference numeral 8 denotes a pads connection wiring for connecting the main bonding pad 6a for assembly to the sub-bonding pad 7 for analysis.

The first electronic circuit formed at the inner active region 3 is connected to the second electronic circuit formed at outer active region 4 by circuit-to-circuit interconnection wirings (not shown). This holds true for the other embodiments.

In the vicinity of the main bonding pad 6 for assembly is formed a protection circuit (reference numeral 9a is a protection circuit inside the opposing region 5 and reference numeral 9b is a protection circuit outside the opposing region 5) for protecting the electronic circuit formed on the semiconductor substrate 2 from a surge applied thereto from the outside via the main bonding pad 6 for assembly when the semiconductor device 1 is used by a user (purchaser of the semiconductor device 1). A signal applied from the main bonding pad 6 for assembly is applied to the electronic circuit formed on the semiconductor substrate 2 via the protection circuit. For example, in the case where the signal applied from the main bonding pad 6 for assembly is applied to the first electronic circuit formed at the inner active region 3, the protection circuit is provided between the main bonding pad 6 for assembly and the inner active region 3. The signal applied from the main bonding pad 6 for assembly is applied to the first electronic circuit formed in the inner active region 3 via the protection circuit formed between the main bonding pad 6 for assembly and the inner active region 3. The main bonding pad 6 needs the protection circuit in this manner, but the sub- bonding pad 7 for analysis does not need the protection circuit. This is because the user does not use the sub- bonding pad 7 for analysis. Therefore, it is not necessary to provide a space for the protection circuit in the vicinity of the sub-bonding pad 7 for analysis.

The sub-bonding pads 7 for analysis are formed between the edges 2a, 2b of the semiconductor substrate 2 and the outer active region 4 along the outer periphery of the outer active region 4, as many as the main bonding pads 6a for assembly which are formed inside the opposing region 5 where the inner active region 3 is opposed to the outer active region 4 and along the outer periphery of the outer active region 4. The main bonding pads 6a for assembly formed inside the opposing region 5 are connected to the sub-bonding pads 7 for analysis by the pad-to-pad interconnection wirings 8 on a 1 to 1 basis. In the example shown in FIG. 1, three main bonding pads 6a for assembly are formed inside the opposing region 5 on the right side of the inner active region 3 and three sub-bonding pads 7 for analysis connected to these three main bonding pads 6a for assembly on a 1 to 1 basis are formed between the edge 2a of the semiconductor substrate 2 and the outer active region 4 along the outer periphery of the outer active region 4. Similarly, three main bonding pads 6a for assembly are formed inside the opposing region 5 on the left side of the inner active region 3, and three sub-bonding pads 7 for analysis connected to these three main bonding pads 6a for assembly on a 1 to 1 basis are formed between the edge 2b of the semiconductor substrate 2 and the outer active region 4 along the outer periphery of the outer active region 4.

Such semiconductor device 1 is mounted on the die pad of the lead frame and the main bonding pads 6 for assembly are connected to the leads of the lead frame by the bonding wires. Usually, the semiconductor device 1 is sealed with resin in this state and is set in a package. Here, the bonding wires connected to the main bonding pads 6a for assembly formed inside the opposing region 5 where the inner active region 3 is opposed to the outer active region 4 pass over the outer active region 4.

Next, the failure analysis method of the semiconductor device 1 in accordance with the present embodiment 1 will be described about a case where the failure is caused in the outer active region 4.

In the first place, the semiconductor device 1 is inspected for electric characteristics in the state where the semiconductor device is set in a package to make sure a region where a failure is caused. By this inspection of the electric characteristics, a failed region can be located in up to one of a plurality of small regions into which the outer active region 4 is divided.

Then, the package is opened to expose the surface of the semiconductor device 1.

Thereafter, the bonding wire passing over the failed region which is located by the above described inspection of the electric characteristics is removed from the main bonding pad 6a for assembly.

Then, the bonding wire removed from the main bonding pad 6a for assembly is bonded to the sub-bonding pad 7 for analysis connected to the main bonding pad 6a for assembly to which the removed bonding wire has been connected via the pad-to-pad interconnection wirings 8.

Then, in the same electric state as in the above mentioned inspection of electric characteristics, a failed point is narrowed down in the failed region by the use of an analyzing unit such as an optical microscope, an emission microscope, and an electron beam tester. The semiconductor device 1 is visually checked for an abnormality in appearance by the optical microscope and then is searched for an abnormal light emitting point by the emission microscope. If any abnormal point is not found even by this inspection, a wiring is inspected for an abnormal potential by the electron beam tester. In this manner, the failed point is narrowed down.

Thereafter, the minute failed point narrowed down in this manner is examined in detail by a physical analysis method to diagnose the cause of the failure.

In this manner, according to the present embodiment 1, the sub-bonding pads 7 for analysis are formed outside the opposing region 5 where the inner active region 3 is opposed to the outer active region 4, as many as the main bonding pads for assembly formed inside the opposing region 5, and the main bonding pads 6a for assembly formed inside the opposing region 5 are connected to the sub-bonding pads 7 for analysis by the pad-to-pad interconnection wirings 8 on a 1 to 1 basis. By this arrangement, before the narrowing down of the failed point in the failed region in the outer active region 4, by removing the bonding wire passing over the failed region from the main bonding pad 6a for assembly and by bonding the bonding wire removed from the main bonding pad 6a for assembly to the sub-bonding pad 7 for analysis connected to the main bonding pad 6a for assembly to which the bonding wire has been connected via the pad-to-pad interconnection wiring 8, it is possible to narrow down the failed point in the state where there is no bonding wire over the failed region. Therefore, it is possible to produce an effect of narrowing down the failed point by the use of the analyzing unit such as the optical microscope, the emission microscope, and the electron beam tester.

Further, since the sub-bonding pad 7 for analysis can be formed in a smaller size than the main bonding pad 6 for assembly, it is possible to prevent the semiconductor device 1 from increasing in area. The reason why the sub-bonding pad 7 for analysis can be formed in a smaller size than the main bonding pad 6 for assembly is as follows: it is required that the main bonding pad 6 for assembly must be touched with a probing needle when the semiconductor device 1 is tested in the state of a wafer and that a bonding wire must be mechanically bonded to the main bonding pad 6 for assembly when the semiconductor device 1 is packaged, so that the main bonding pad 6 for assembly needs to be formed in a large size of a certain extent, but the sub-bonding pad 7 for analysis does not have such necessities; and the bonding wire can be manually bonded to the main bonding pad 6 for assembly with high accuracy.

Incidentally, in the above failure analysis method has been described the case where the failed region is located in one of the plurality of small regions into which the outer active region 4 is divided by inspecting the semiconductor device 1 for electric characteristics in the state where the semiconductor device 1 is set in a package, but in the case where the failed region can not be located in up to such a small region, all the bonding wires passing over the outer active region 4 are removed from the assembly bonding pads 6a and the respective bonding wires are bonded to the sub-bonding pads 7 for analysis connected to the main bonding pads 6a for assembly to which the respective bonding wires have been connected via the pad-to-pad interconnection wirings 8. In this manner, it is possible to narrow down the failed point in the outer active region 4.

Embodiment 2

In the embodiment 1 has been described the case where the sub-bonding pads 7 for analysis are formed between the edges 2a, 2b of the semiconductor substrate 2 and the outer active regions 4. In the present embodiment 2 will be described the case where sub-bonding pads for analysis are formed in a space extending in a line of pads of a plurality of main bonding pads for assembly formed along the outer periphery of the inner active region outside the opposing region where an inner active region is opposed to an outer active region.

Figure 2:
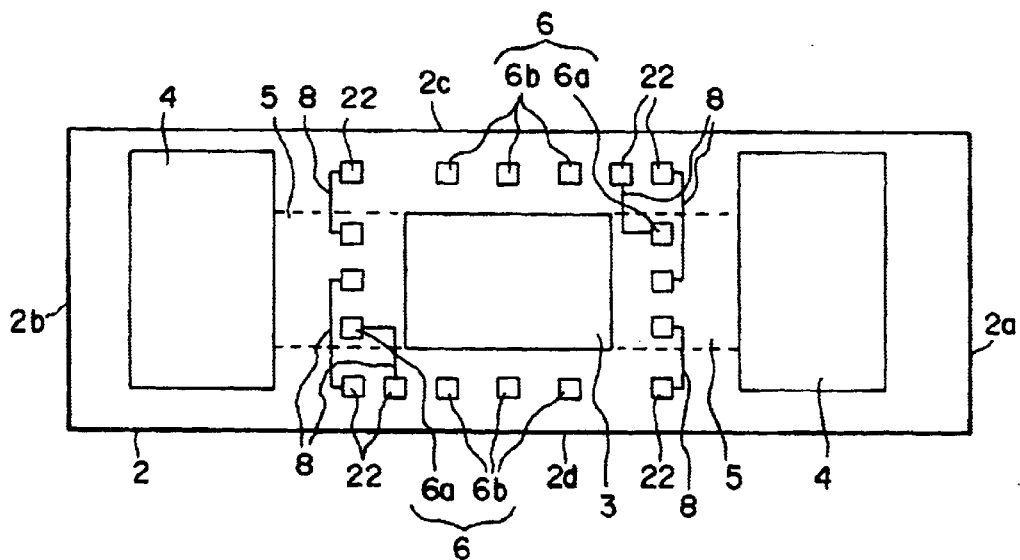
FIG. 2 is a plan view to show the configuration of a semiconductor device in accordance with an embodiment 2 of the present invention.

FIG. 2 is a plan view to show the configuration of a semiconductor device in accordance with an embodiment 2 of the present invention. In FIG. 2, a reference numeral 21 denotes a semiconductor device and a reference numeral 22 denotes a sub-bonding pad for analysis formed along the outer periphery of the inner active region in a space extending in a line of main bonding pads 6b for assembly outside a opposing region 5 where an inner active region 3 is opposed to an outer active region 4. The other constituent elements are equal to or similar to those designated by the same reference numerals in FIG. 1.

There are provided the sub-bonding pads 22 for analysis as many as the main bonding pads for assembly formed inside the opposing region 5 where the inner active region 3 is opposed to the outer active region 4. The main bonding pads 6a for assembly formed inside the opposing region 5 are connected to the sub-bonding pads 22 for analysis by the pad-to-pad interconnection wirings 8 on a 1 to 1 basis. In the example shown in FIG. 2, three main bonding pads 6a for assembly are formed inside the opposing region 5 on the right side of the inner active region 3 and two of three sub-bonding pads 22 for analysis connected to these three main bonding pads 6a for assembly on a 1 to 1 basis are formed in the space extending in the line of the main bonding pads 6b for assembly formed on the upper side of the inner active region 3 and one remaining sub-bonding pad 22 for analysis is formed in the space extending in the line of the main bonding pads 6b for assembly formed on the lower side of the inner active region 3. Similarly, three main bonding pads 6a for assembly are formed inside the opposing region 5 on the left side of the inner active region 3 and two of three sub-bonding pads 22 for analysis connected to these three main bonding pads 6a for assembly on a 1 to 1 basis are formed in the space extending in the line of the main bonding pads 6b for assembly formed on the lower side of the inner active region 3 and one remaining sub-bonding pad 22 for analysis is formed in the space extending in the line of the main bonding pads 6b for assembly formed on the upper side of the inner active region 3.

The failure analysis method of the semiconductor device 21 is the same as in the case of the embodiment 1.

As described above, according to the embodiment 2, outside the opposing region 5 where the inner active region 3 is opposed to the outer active region 4 are provided as many sub-bonding pads 22 for analysis as there are main bonding pads for assembly formed inside the opposing region 5, and the main bonding pads 6a for assembly formed inside the opposing region 5 are connected to the sub-bonding pads 22 for analysis by the pad-to-pad interconnection wirings 8 on the 1 to 1 basis. By this arrangement, the present embodiment 2 can produce the same effect as the embodiment 1.

Further, according to the present embodiment 2, since the sub-bonding pads 22 for analysis are formed in the space extending in the line of the main bonding pads 6b for assembly formed outside the opposing region 5 where the inner active region 3 is opposed to the outer active region 4, it is possible to produce an effect that the semiconductor device 21 in accordance with the embodiment 2 is smaller in area than the semiconductor device 1 in accordance with the embodiment 1.

Incidentally, while the case where the sub-bonding pads 22 for analysis are formed in the space extending in the line of the plurality of main bonding pads 6b for assembly formed outside the opposing region 5 where the inner active region 3 is opposed to the outer active region 4 has been described in the present embodiment, also the case where the sub-bonding pads 22 for analysis are formed in the vacant spaces of the line of pads can produce the same effect.

Embodiment 3

In the embodiment 1 and the embodiment 2 have been described the cases where there are provided the sub-bonding pads 7 or 22 for analysis as many as the main bonding pads 6a for assembly formed inside the opposing region 5 where the inner active region 3 is opposed to the outer active region 4. In an embodiment 3 will be described a case where there are provided sub-bonding pads for analysis not so many as main bonding pads for assembly formed inside the opposing region where the inner active region is opposed to the outer active region.

Figure 3:
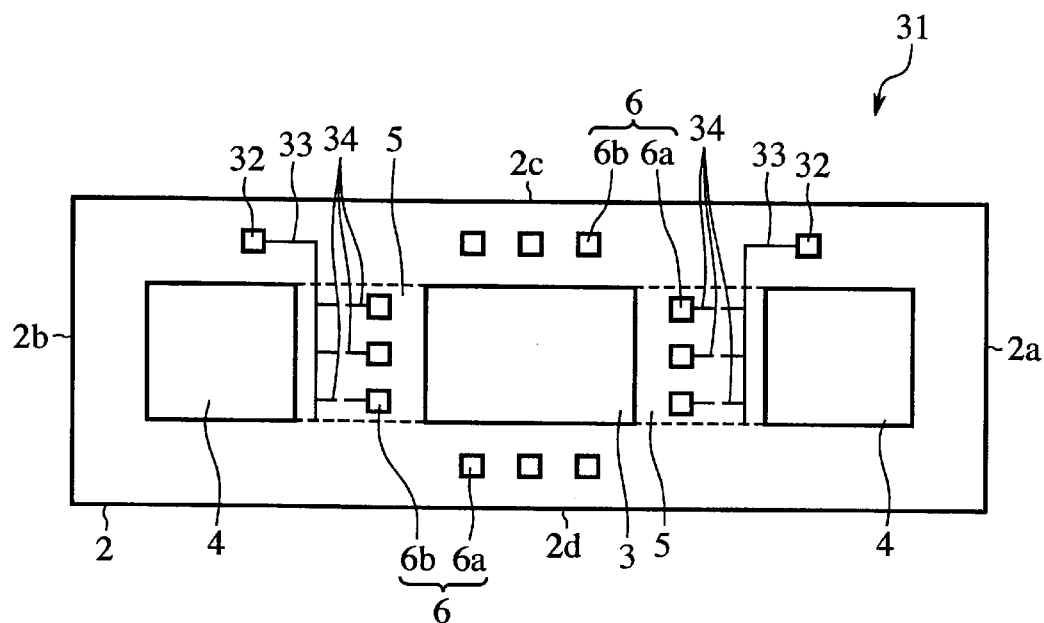
FIG. 3 is a plan view to show the configuration of a semiconductor device in accordance with an embodiment 3 of the present invention.

FIG. 3 is a plan view to show the configuration of a semiconductor device in accordance with the embodiment 3 of the present invention. In FIG. 3, a reference numeral 31 denotes a semiconductor device; a reference numeral 32 denotes a sub-bonding pad for analysis formed outside the opposing region 5 where an inner active region 3 is opposed to an outer active region 4; a reference numeral 33 denotes a first pad-to-pad interconnection wiring extending from the sub-bonding pad 32 for analysis; and a reference numeral 34 denotes a second pad-to-pad interconnection wiring extending from each main bonding pad 6a for assembly formed in the opposing region 5 and connected to the first pad-to-pad interconnection wiring 33 with a cut portion at a part (i.e. a gap formed therein). The other constituent elements are equal to or similar to those denoted by the same reference numerals in FIG. 1.

A pad-to-pad interconnection means is constituted by the first pad-to-pad interconnection wiring 33 and the second pad-to-pad interconnection wiring 34.

The sub-bonding pads 32 for analysis are provided with fewer number of pieces than the main bonding pads 6a for assembly formed in the opposing region 5 where the inner active region 3 is opposed to the outer active region 4. When the failed point is narrowed down in the failed region in the outer active region 4, the sub-bonding pad 32 for analysis is electrically connected to any one of the plurality of main bonding pads 6a for assembly formed inside the opposing region 5 by connecting the cut portion in any one of the second pad-to-pad interconnection wirings 34 by the use of a focused ion beam (FIB). In the example shown in FIG. 3, three main bonding pads 6a for assembly are formed inside the opposing region 5 on the right side of the inner active region 3 and one sub-bonding pad 32 for analysis is formed outside the opposing region 5. When the failed point is narrowed down in the failed region in the outer active region 4, the one sub-bonding pad 32 for analysis can be electrically connected to any one of these three main bonding pads 6a for assembly by connecting the cut portion in any one of the second pad-to-pad interconnection wirings 34 by the use of the FIB. Similarly, three main bonding pads 6a for assembly are formed inside the opposing region 5 on the left side of the inner active region 3 and one sub-bonding pad 32 for analysis is formed outside the opposing region 5. When the failed point is narrowed down in the failed region in the outer active region 4, the one sub-bonding pad 32 for analysis can be electrically connected to any one of these three main bonding pads 6a for assembly by connecting the cut portion in any one of the second pad-to-pad interconnection wirings 34 by the use of the FIB. Next, a failure analysis method of the semiconductor device 31 in accordance with the present embodiment 3 will be described.

In the first place, the semiconductor device 31 is inspected for electrical characteristics in the state where the semiconductor device 31 is set in a package to make sure a region where a failure is caused. By this inspection of the electric characteristics, the failed region can be located in up to one of a plurality of small regions into which the outer active region 4 is divided.

Then, the package is opened to expose the surface of the semiconductor device 31. Then, the bonding wire passing over the failed region located by the above mentioned inspection of electric characteristics is removed from the main bonding pad 6a for assembly. Then, the bonding wire removed from the main bonding pad 6a for assembly is bonded to the sub-bonding pad 32 for analysis.

Then, the cut portion in the second pad-to-pad interconnection wiring 34 connected to the main bonding pad 6a for assembly from which the bonding wire is removed is connected by the use of the FIB. Then, in the same electrical state as in the above mentioned inspection of electrical characteristics, the failed point is narrowed down in the failed region by the use of an analyzing unit such as an optical microscope, an emission microscope and an electron beam tester. The semiconductor device 31 is visually checked for an abnormality in appearance by the optical microscope and then is searched for an abnormal light emitting point by the emission microscope. If any abnormal point is not found even by this inspection, a wiring is inspected for an abnormal potential by the electron beam tester. In this manner, the failed point is narrowed down.

Thereafter, the minute failed point narrowed down in this manner is examined in detail by a physical analysis method to diagnose the cause of the failure. In this manner, according to the present embodiment 3, the sub-bonding pads 32 for analysis not so many as the main bonding pads 6a for assembly formed inside the opposing region 5 where the inner active region 3 is opposed to the outer active region 4 are formed outside the opposing region 5, and the first pad-to-pad interconnection wirings 33 are connected to the sub-bonding pads 32 for analysis, and the second pad-to-pad interconnection wirings 34, each of which is connected to the each first pad-to-pad interconnection wiring 33 with a cut portion at a part, are connected to the respective main bonding pads 6a for assembly formed inside the opposing region 5. By this arrangement, before the narrowing down of the failed point in the failed region in the outer active region 4, by removing the bonding wire passing over the failed region from the main bonding pad 6a for assembly and by bonding the bonding wire removed from the main bonding pad 6a for assembly to the sub-bonding pad 32 for analysis and by connecting the cut portion of the second pad-to-pad interconnection wiring 34, which is connected to the main bonding pad 6a for assembly from which the bonding wire is removed, by the FIB, it is possible to narrow down the failed point in the state where there is no bonding wire over the failed region. Therefore, it is possible to produce the same effect as the embodiment 1.

Further, according to the present embodiment 3, since the sub-bonding pads 32 for analysis are fewer in number than the main bonding pads 6a for assembly formed inside the opposing region 5 where the inner active region 3 is opposed to the outer active region 4, it is possible to produce an affect that the semiconductor device 31 in accordance with the embodiment 3 is smaller in area than the semiconductor device 1 in accordance with the embodiment 1.

Embodiment 4

In the embodiment 4, as is the case with the embodiment 3, will be described a case where there are provided sub-bonding pads for analysis not so many as main bonding pads for assembly formed inside an opposing region where an inner active region is opposed to an outer active region.

Figure 4:
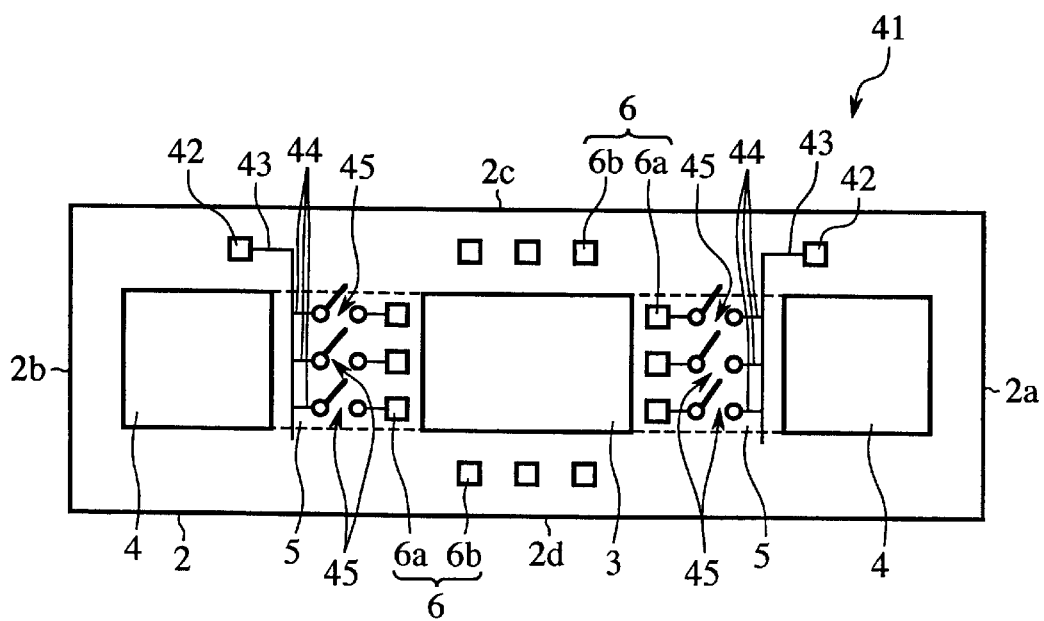
FIG. 4 is a plan view to show the configuration of a semiconductor device in accordance with an embodiment 4 of the present invention.

FIG. 4 is a plan view to show the configuration of a semiconductor device in accordance with an embodiment 4 of the present invention. In FIG. 4, a reference numeral 41 denotes a semiconductor device; a reference numeral 42 denotes a sub-bonding pad for analysis formed outside an opposing region 5 where an inner active region 3 is opposed to an outer active region 4; a reference numeral 43 denotes the first pad-to-pad interconnection wiring extending from the sub-bonding pad 42 for analysis; and a reference numeral 44 denotes the second pad-to-pad interconnection wiring, which extends from each main bonding pad 6a for assembly formed inside the opposing region 5 and is connected to the first pad-to-pad interconnection wiring 43 with a cut portion at a part (i.e. a gap formed therein); and a reference numeral 45 denotes a switch provided at the cut portion in each second pad-to-pad interconnection wiring 44. The other constituent elements are equal to or similar to those denoted by the same reference numerals in FIG. 1.

A pad-to-pad interconnection means is constituted by the first pad-to-pad interconnection wiring 43 and the second pad-to-pad interconnection wiring 44 and the switch 45.

The sub-bonding pads 42 for analysis are fewer in number than the main bonding pads 6a for assembly formed inside the opposing region 5 where the inner active region 3 is opposed to the outer active region 4. In the example shown in FIG. 4, three main bonding pads 6a for assembly are formed inside the opposing region 5 on the right side of the inner active region 3 and one sub-bonding pad 42 for analysis is formed outside the opposing region 5. When the failed point is narrowed down in the failed region in the outer active region 4, the one sub-bonding pad 42 for analysis can be electrically connected to any one of these three main bonding pads 6a for assembly. Similarly, three main bonding pads 6a for assembly are formed inside the opposing region 5 on the left side of the inner active region 3 and one sub-bonding pad 42 for analysis is formed outside the opposing region 5. When the failed point is narrowed down in the failed region in the outer active region 4, the one sub-bonding pad 42 for analysis can be electrically connected to any one of these three main bonding pads 6a for assembly.

In the inner active region 4 of the semiconductor device 41 is provided a central processing unit (CPU, not shown). The respective switches 45 are controlled and turned on or off by the CPU. When the switch 45 is turned on, the cut portion in the second pad-to-pad interconnection wiring 44 is brought into conduction and when the switch 45 is turned off, the cut portion in the second pad-to-pad interconnection wirings 44 is brought out of conduction.

When the failed point is narrowed down in the failed region in the outer active region 4, the sub-bonding pad 42 for analysis is electrically connected to any one of the plurality of main bonding pads 6a for assembly formed inside the opposing region 5 by bringing the cut portion in any one of the second pad-to-pad interconnection wirings 44 into conduction by the switch 45.

Next, a failure analysis method of the semiconductor device 41 in accordance with the present embodiment 4 will be described in the case where a failure is caused in the outer active region 4.

In the first place, the semiconductor device 41 is inspected for electrical characteristics in the state where the semiconductor device 41 is set in a package to make sure a region where a failure is caused. By this inspection of electric characteristics, a failed region can be located in up to one of a plurality of small regions into which the outer active region 4 is divided.

Then, the package is opened to expose the surface of the semiconductor device 41. Then, the bonding wire passing over the failed region located by the above mentioned inspection of electric characteristics is removed from the main bonding pad 6a for assembly. Then, the bonding wire removed from the main bonding pad 6a for assembly is bonded to the sub-bonding pad 42 for analysis.

Then, the information of the main bonding pad 6a for assembly from which the bonding wire is removed is applied to the CPU from the outside of the semiconductor device 41. When the information of the main bonding pad 6a for assembly from which the bonding wire is removed is applied to the CPU, the CPU executes a program stored in the semiconductor device 41 or in a memory provided outside the semiconductor device 41. Then, the CPU controls the respective switches 45 based on the results obtained by executing the program and turns on the switch 45 provided at the cut portion in the second pad-to-pad interconnection wiring 44 connected to the main bonding pad 6a for assembly from which the bonding wire is removed to thereby bring the cut portion in the second pad-to-pad interconnection wiring 44, which is connected to the main bonding pad 6a for assembly from which the bonding wire is removed, into conduction.

Then, in the same electrical state as in the above mentioned inspection of electrical characteristics, the failed point is narrowed down in the failed region by the use of an analyzing unit such as an optical microscope, an emission microscope and an electron beam tester. The semiconductor device 41 is visually checked for an abnormality in appearance by the optical microscope and then is searched for an abnormal light emitting point by the emission microscope. If any abnormal point is not found even by this inspection, a wiring is inspected for an abnormal potential by the electron beam tester. In this manner, the failed point is narrowed down.

Thereafter, the minute failed point narrowed down in this manner is examined in detail by a physical analysis method to diagnose the cause of the failure. In this manner, according to the present embodiment 4, the sub-bonding pads 32 for analysis not so many as the main bonding pads 6a for assembly formed inside the opposing region 5 where the inner active region 3 is opposed to the outer active region 4 are formed outside the opposing region 5, and the first pad-to-pad interconnection wirings 43 are connected to the sub-bonding pads 42 for analysis, and the second pad-to-pad interconnection wirings 44, each of which is connected to the each first pad-to-pad interconnection wiring 43 with a cut portion at a part, are connected to the respective main bonding pads 6a for assembly formed inside the opposing region 5, and the switches 45 are provided in the cut portions in the respective second pad-to-pad interconnection wirings 44. By this arrangement, before the narrowing down of the failed point in the failed region in the outer active region 4, by removing the bonding wire passing over the failed region from the main bonding pad 6a for assembly and by bonding the bonding wire removed from the main bonding pad 6a for assembly to the sub-bonding pad 42 for analysis and by applying the information of the main bonding pad 6a for assembly from which the bonding wire is removed to the CPU and by bringing the cut portion in the second pad-to-pad interconnection wiring 44 connected to the main bonding pad 6a for assembly from which the bonding wire is removed into conduction by the switch 45, it is possible to narrow down the failed point in the state where there is no bonding wire over the failed region. Therefore, it is possible to produce the same effect as the embodiment 1.

Further, according to the present embodiment 4, since the sub-bonding pads 42 for analysis are fewer in number than the main bonding pads 6a for assembly formed inside the opposing region 5 where the inner active region 3 is opposed to the outer active region 4, it is possible to produce an affect that the semiconductor device 41 in accordance with the embodiment 4 is smaller in area than the semiconductor device 1 in accordance with the embodiment 1.

Further, according to the present embodiment 4, the switches 45 are provided at the cut portions in the respective second pad-to-pad interconnection wirings 44, so that it is possible to produce an effect that there is no need for using the FIB when the failed point is narrowed in the failed region in the outer active region 4.

Embodiment 5

In order to narrow down the failed point in the failed region in the outer active region 4 in the same electric state as is the case where the semiconductor device set in a package is inspected for the electric characteristics, in the embodiments 1 to 4 have been described the cases where the sub-bonding pads 7, 22, 32, or 42 for analysis are formed outside the opposing region 5 where the inner active region 3 is opposed to the outer active region 4. In the present embodiment 5 will be described a case where a scan register is provided at a circuit-to-circuit interconnection wiring for connecting the first electronic circuit formed in an inner active region 3 to the second electronic circuit formed in an outer active region 4.

Figure 5:
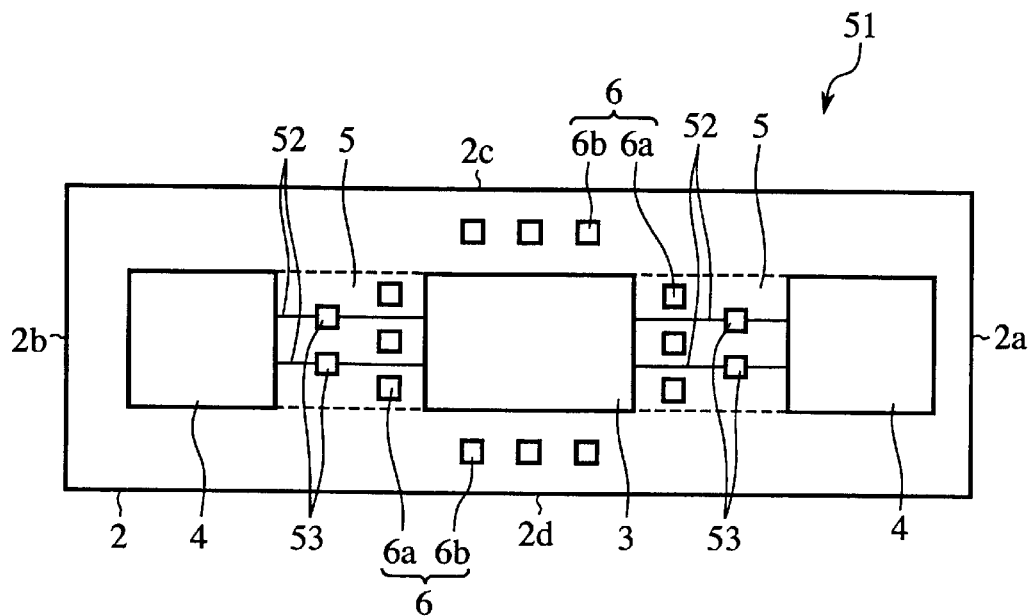
FIG. 5 is a plan view to show the configuration of a semiconductor device in accordance with an embodiment 5 of the present invention.
Figure 6:
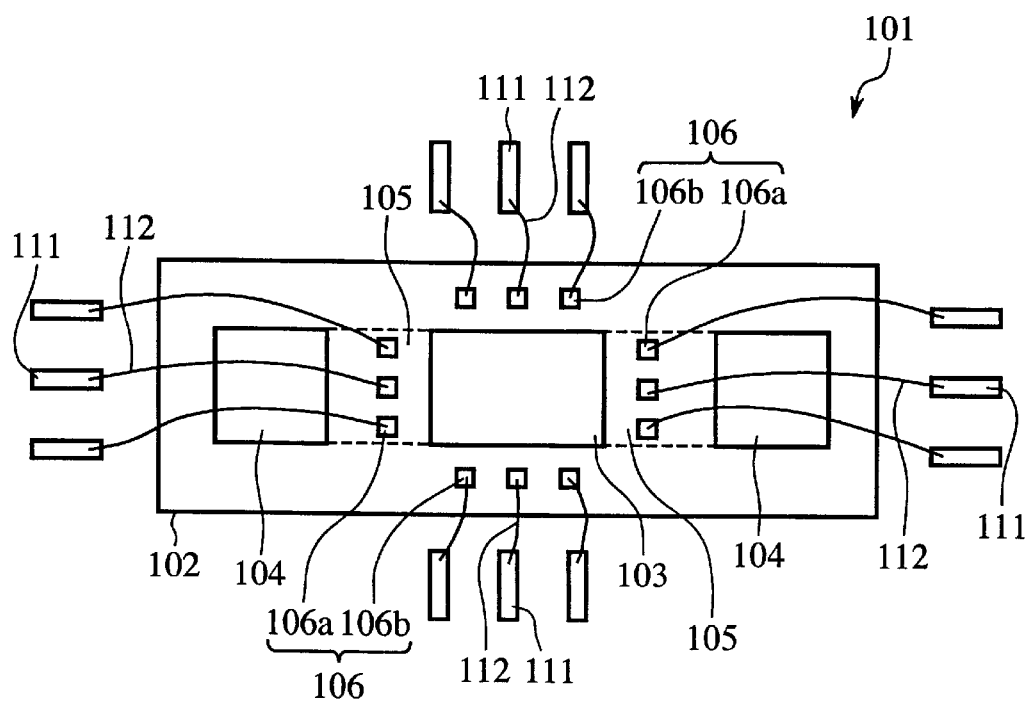
FIG. 6 is a plan view to show the configuration of a semiconductor device in the prior art.

FIG. 5 is a plan view to show the configuration of a semiconductor device in accordance with the embodiment 5 of the present invention. In FIG. 5, a reference numeral 51 denotes a semiconductor device; a reference numeral 52 denotes a circuit-to-circuit interconnection wiring for connecting the first electronic circuit formed in the inner active region 3 to the second electronic circuit formed in the outer active region 4; and a reference numeral 53 denotes a scan register provided at each circuit-to-circuit interconnection wiring 52. The other constituent elements are equal to or similar to those denoted by the same reference numerals in FIG. 1.

A central processing unit (CPU, not shown) is provided in the outer active region 4 of the semiconductor device 51. The respective registers are set at a state of "0" (GND level) or a state of "1" (power source level) by the control of the CPU and hold the set states. When the scan register is set at the state of "0" (GND level), a signal of the GND level is applied to the outer active region 4 via the circuit-to-circuit interconnection wiring 52 and when the scan register is set at the state of "1" (power source level), a signal of the power source level is applied to the outer active region 4 via the circuit-to-circuit interconnection wiring 52.

Next, a failure analysis method of the semiconductor device 51 in accordance with the present embodiment 5 will be described in the case where a failure is caused in the outer active region 4.

In the first place, the semiconductor device 51 is inspected for electric characteristics in the state where the semiconductor device 51 is set in a package to make sure a region where a failure is caused. By this inspection of the electric characteristics, a failed region can be located in up to one of a plurality of small regions into which the outer active region 4 is divided.

Then, the package is opened to expose the surface of the semiconductor device 41. Then, the bonding wire passing over the failed region located by the above mentioned inspection of electric characteristics is removed from the main bonding pad 6a for assembly. Then, the CPU sets the respective scan registers 53 at the state of "0" (GND level)

or the state of "1" (power source level) such that the signal applied to the outer active region 4 via the circuit-to-circuit interconnection wiring 52 is made equal to the signal applied to the outer active region 4 from the inner active region 3 via the circuit-to-circuit interconnection wiring 52 when the above mentioned inspection of electric characteristics is performed to thereby make the electric state of the outer active region 4 equal to the state when the above mentioned inspection of electric characteristics is performed. Then, a failed point is narrowed in the failed region by the use of an analyzing unit such as an optical microscope, an emission microscope and an electron beam tester. The semiconductor 51 is visually checked for an abnormality in appearance by the optical microscope and then is searched for an abnormal light emitting point by the emission microscope. If any abnormal point is not found even by this inspection, a wiring is inspected for an abnormal potential by the electron beam tester. In this manner, the failed point is narrowed down.

Thereafter, the minute failed point narrowed down in this manner is examined in detail by a physical analysis method to diagnose the cause of the failure. In this manner, according to the present embodiment 5, the scan registers 53 are provided at the respective circuit-to-circuit interconnection wirings 52. By this arrangement, before the narrowing down of the failed point in the failed region in the active region 4, by removing the bonding wire passing over the failed region from the main bonding pad 6a for assembly and by setting the respective scan registers 53 at the state of "0" (GND level) or the state of "1" (power source level) such that the signal applied to the outer active region 4 via the circuit-to-circuit interconnection wiring 52 is made equal to the signal applied to the outer active region 4 from the inner active region 3 via the circuit-to-circuit interconnection wiring 52 when the semiconductor device 51 is inspected for the electric characteristics in the state where the semiconductor device 51 is set in a package, it is possible to narrow down the failed point in the state where there is no bonding wire over the failed region. Therefore, it is possible to produce the same effect as the embodiment 1.

Further, according to the present embodiment 5, the scan registers are provided in the respective circuit-to-circuit interconnection wirings 52, so that it is possible to produce an effect of eliminating the need for providing the sub-bonding pads for analysis.

Incidentally, in the above mentioned failure analysis method has been described the case where the failed point can be located in up to one of the plurality of small regions into which the outer active region 4 is divided by inspecting the electric characteristics of the semiconductor device 51 in the state where the semiconductor device 51 is set in a package, but in the case where the failed point can not located in up to such a small region, it is possible to narrow down the failed point in the outer active region 4 by removing all the bonding wires passing over the outer active region 4 from the main bonding pads 6a for assembly.

What is claimed is:

1. A semiconductor device comprising:

a semiconductor substrate;

an inner active region including a first electronic circuit formed on the semiconductor substrate;

a plurality of outer active regions which are located at symmetrical positions in relation to said inner active region and positioned between the edge of said semiconductor substrate and said inner active region and including a second electronic circuit formed on said semiconductor substrate;

a main bonding pad which is connected with said inner active region through a protection circuit to eliminate a surge from outside and formed inside an opposing region where said inner active region is opposed to said outer active regions and along the outer periphery of said inner active region;

a sub-bonding pad which is smaller than said main bonding pad and formed outside the region where said inner active region is opposed to said outer active regions; and a pad-to-pad interconnection wiring for connecting said main bonding pad to said sub-bonding pad.

2. A semiconductor device as claimed in claim 1, wherein said sub-bonding pad is formed along the outer periphery of the outer active region.

3. A semiconductor device as claimed in claim 1, wherein said sub-bonding pad is formed in a space extending in a line of pads of a plurality of main bonding pads formed along the outer periphery of said inner active region outside the region where the inner active region is opposed to the outer active region, or in a vacant space of the line of the pads.

4. A semiconductor device comprising:

a semiconductor substrate;

an inner active region including a first electronic circuit formed on the semiconductor substrate;

a plurality of outer active regions which are located at symmetrical positions in relation to said inner active region and positioned between the edge of said semiconductor substrate and said inner active region and including a second electronic circuit formed on said semiconductor substrate;

a plurality of main bonding pads which are connected with said inner active region through a protection circuit to eliminate a surge from outside and formed inside an opposing region where said inner active region is opposed to said outer active regions and along the outer periphery of said inner active region;

a sub-bonding pad which is smaller than said main bonding pads and formed outside the region where said inner active region is opposed to said outer active regions; and a pad-to-pad interconnection wiring for electrically connecting any one of said main bonding pads to said sub-bonding pad.

5. A semiconductor device as claimed in claim 4, wherein said pad-to-pad interconnection wiring has a first pad-to-pad interconnection wiring extending from the sub-bonding pad and a second pad-to-pad interconnection wiring extending from each main bonding pad and connected to said first pad-to-pad interconnection wiring with a gap formed therein.

6. A semiconductor device as claimed in claim 4, wherein said pad-to-pad interconnection wiring has a first pad-to-pad interconnection wiring extending from the sub- bonding pad, a second pad-to-pad interconnection wiring extending from each main bonding pad and connected to said first pad-to-pad interconnection wiring with a gap formed wherein, and a switch provided at the gap in each second pad-to-pad interconnection wiring and for electrically connecting across the gap.

7. A semiconductor device comprising:

a semiconductor substrate;

an inner active region including a first electronic circuit formed on the semiconductor substrate;

a plurality of outer active regions which are located at symmetrical positions in relation to said inner active region and positioned between the edge of said semiconductor substrate and said inner active region and including a second electronic circuit formed on said semiconductor substrate;

a main bonding pad which is connected with said inner active region through a protection circuit to eliminate a surge from outside and formed inside an opposing region where said inner active region is opposed to said outer active regions and along the outer periphery of said inner active region;

a circuit-to-circuit interconnection wiring for connecting said first electronic circuit to said second electronic circuit; and a scan register provided in the circuit-to-circuit interconnection wiring.

* * * * *